United States Patent [19]

Farwell

[11] Patent Number: 5,473,617
[45] Date of Patent: Dec. 5, 1995

[54] HIGH IMPEDANCE TECHNIQUE FOR TESTING INTERCONNECTIONS IN DIGITAL SYSTEMS

[75] Inventor: William D. Farwell, Thousand Oaks, Calif.

[73] Assignee: Hughes Aircraft Company, Los Angeles, Calif.

[21] Appl. No.: 78,710

[22] Filed: Jun. 17, 1993

Related U.S. Application Data

[63] Continuation-in-part of Ser. No. 725,134, Jul. 3, 1991, abandoned.

[51] Int. Cl.[6] ............................ G01R 31/28; H03K 19/00
[52] U.S. Cl. .................................................. 371/22.3
[58] Field of Search .................. 371/22.1, 22.3, 371/15.1, 22.5

[56] References Cited

U.S. PATENT DOCUMENTS 5,115,191  5/1992  Yoshimori .............................. 371/22.1
5,202,625  4/1993  Farwell .................................. 371/22.3
5,285,119  2/1994  Takahashi ............................. 371/22.1

Primary Examiner—Emanuel T. Voeltz
Assistant Examiner—Edward Pipala
Attorney, Agent, or Firm—Leonard A. Alkov; W. K. Denson-Low

[57] ABSTRACT

A boundary scan transmit cell having a three-state output buffer and logic circuitry for controlling the enabled or disabled state of the three-state buffer as a function of a scan input; and a boundary scan receive cell having an input buffer and a holding circuit for changing the input of the buffer to a predetermined logical state if such input is open or at a high impedance. Also disclosed is a bidirectional boundary scan cell that includes the functions of the disclosed boundary scan transmit and receive scan cells.

3 Claims, 4 Drawing Sheets

HIGH IMPEDANCE TECHNIQUE FOR TESTING INTERCONNECTIONS IN DIGITAL SYSTEMS

This is a continuation-in-part of commonly assigned U.S. application Ser. No. 07/725,134, filed Jul. 3, 1991, now abandoned.

BACKGROUND OF THE INVENTION

The subject invention is directed generally to boundary scan circuits, and is directed more particularly to a boundary scan transmit or drive circuit that includes a three-state output buffer.

Boundary scan testing is commonly utilized to test the interconnections between digital devices that comprise a system, where the interconnected devices can include integrated circuits, application specific integrated circuits (ASICs), hybrids, and circuit boards, for example. For boundary scan test capability, a device includes scan circuits that are capable of isolating device I/O pins from the interior logic of the device and directly accessing such I/O pins, which allows special interconnection test patterns to be applied and observed without interference from the interior logic functions.

Boundary scan test capability is commonly implemented with boundary scan cells respectively associated with those I/O pins for which boundary scan testing capability is being provided, with each boundary scan cell containing a scan flip-flop. The scan flip-flops are arranged into a register chain that is capable of operation in serial and parallel modes, so that test patterns can be loaded serially, applied in parallel, and test results can be read out serially.

For testing, special interconnection test patterns are serially loaded into scan flip-flops for output pins. After a test pattern is loaded, the output scan cells containing the test pattern are switched to drive their associated output pins in accordance with the test pattern. Subsequently, the signals observed on input pins are stored in associated input scan flip-flops. The stored inputs are then serially read out to evaluate the test. A further test pattern can be serially loaded into output scan flip-flops while stored inputs are being serially read out.

Boundary scan test patterns are basically designed to achieve the following:

1. To drive each device output to the high state and to the low state at different times. Proper reception at the appropriate inputs verifies continuity.

2. To drive each device output to the state opposite that of all other outputs, for both the low state and the high state. A short circuit between two or more outputs will be indicated by contention between the shorted drivers.

The paper "INTERCONNECT TESTING WITH BOUNDARY SCAN," Wagner, IEEE Proc. 1987 International Test Conference, pages 52–57, generally describes the application and implementation of boundary scan testing, and test patterns that allow for efficient boundary scan testing.

A consideration with known boundary scan circuitry is uncertainty in the interpretation of test results. For example, signal-to-signal shorts ("bridging") causes contention between drivers, and the resulting voltage cannot be predicted. Open lines allow inputs to float, thereby causing unknown voltages.

A further consideration with known boundary scan circuitry is potential damage that can result from shorted contending drivers that attempt to drive each other to the opposite state, which draws excessive current and is potentially damaging. Contention also occurs if test patterns are incorrectly configured or applied.

Another consideration with known boundary scan circuitry is the possible failure to detect moderate to high resistance shorts, caused for example by a "whisker" of metal between traces with a resistance of hundreds or thousands of ohms.

SUMMARY OF THE INVENTION

It would therefore be an advantage to provide boundary scan circuitry that provides unambiguous signals on the interconnect inputs.

A further advantage would be to provide boundary scan circuitry that protects the I/O circuits of the devices whose interconnections are being tested.

Another advantage would be to provide boundary scan test circuitry that allows for the detection of moderate to high resistance shorts.

The foregoing and other advantages are provided by the invention in a scan circuit that includes (a) a boundary scan transmit cell having a three-state output buffer and logic circuitry for controlling the enabled or disabled state of the three-state buffer as a function of a scan input, and (b) a boundary scan receive cell having an input buffer and a holding circuit that allows the input to be driven to a first or second logical state and which changes the input of the buffer to a predetermined logical state if such input is open or at a high impedance. The transmit scan cell includes a scan flip-flop for storing a scan input; a three-state buffer responsive to a buffer input signal for providing a buffered output signal on an associated output pin of the circuit device in which the cell is implemented; and control logic responsive to the scan flip-flop for selectively enabling or disabling the three-state buffer and for providing a test signal or a device signal as the input signal to the three-state buffer. The receive scan cell includes an input buffer, holding circuitry connected to the input of said input buffer allowing the input of the buffer to be driven to the first or second logical states and for changing the input to the input buffer to a predetermined one of the first and second logical state if the connection to the input buffer is an open connection or a high impedance connection; and a scan flip-flop for controllably storing the output of the input buffer.

Further in accordance with the invention, the functions of the transmit and receive cells can be combined in a bidirectional scan cell.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
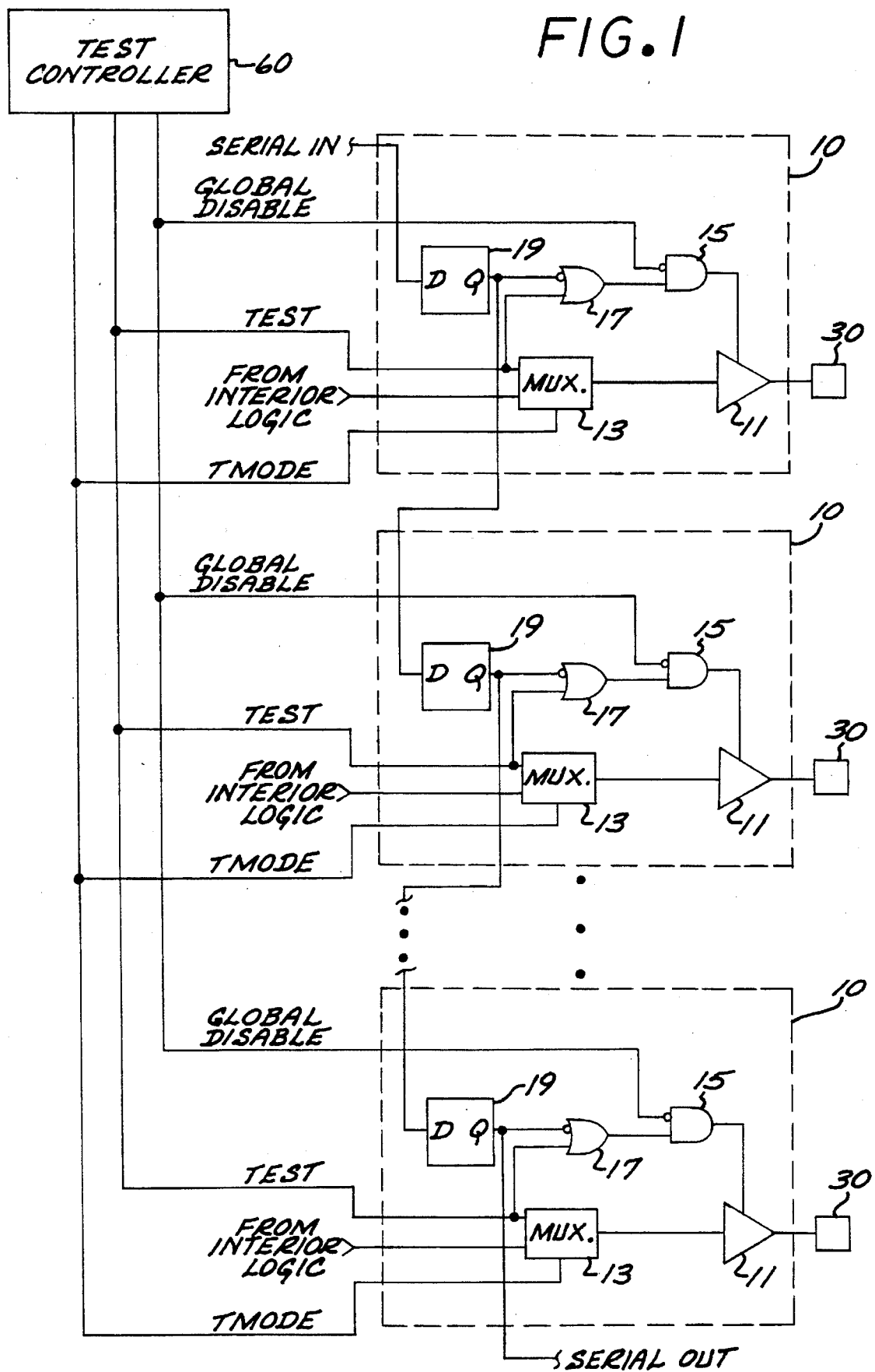
FIG. 1 is a schematic diagram of a series of scan transmit scan cells in accordance with the invention arranged in a scan chain for driving associated device outputs for boundary scan testing.

In the following detailed description and in the several figures of the drawing, like elements are identified with like reference numerals.

Figure 2:
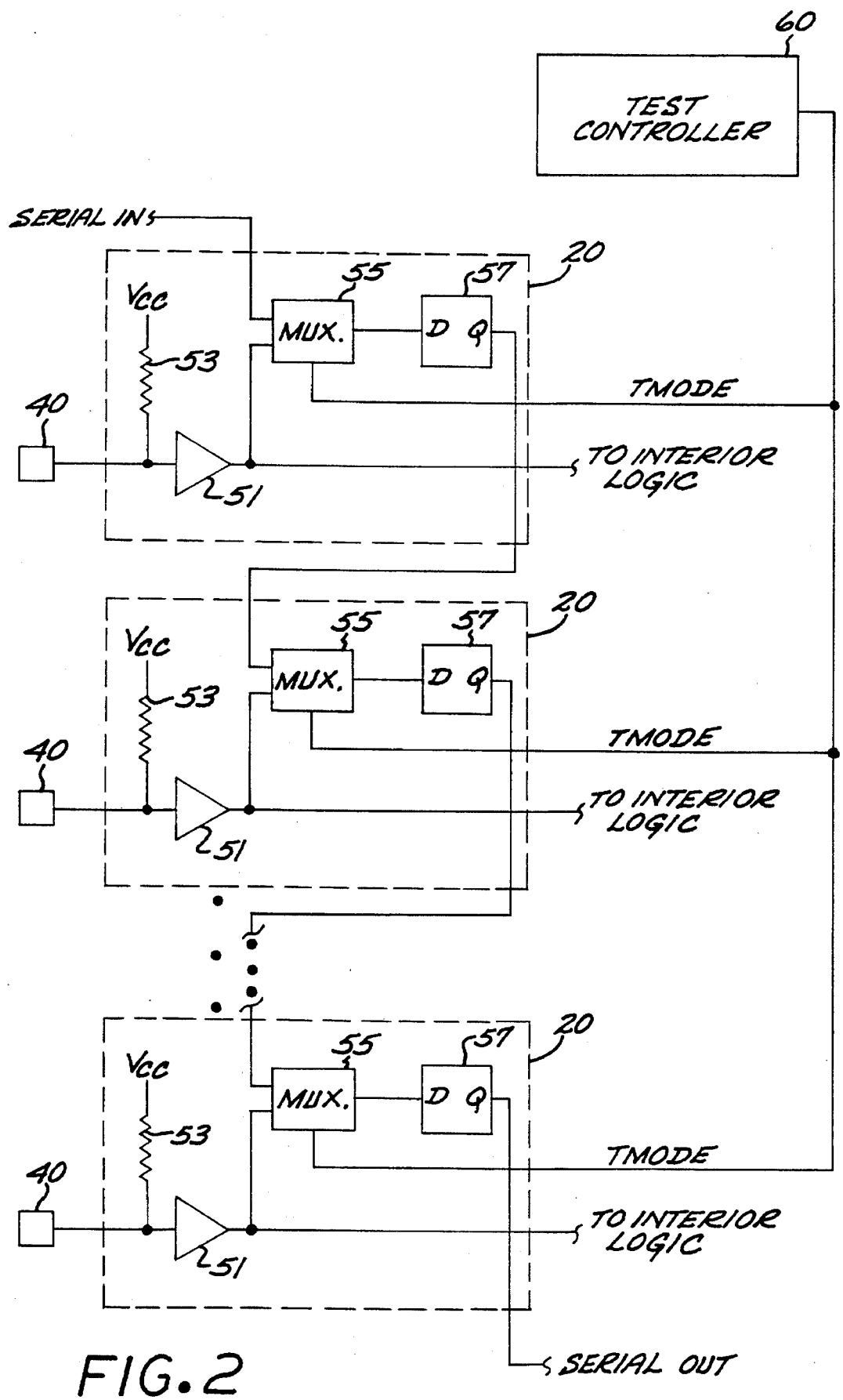
FIG. 2 is a schematic diagram of a series of scan receive scan cells arranged in a scan chain for monitoring associated device inputs interconnected to outputs of another device which are driven by transmit cells of FIG. 1.

FIG. 1 schematically depicts a series of transmit cells 10 in accordance with the invention arranged in a scan chain, and FIG. 2 schematically depicts a series of receive cells 20 arranged in a register chain which can be utilized to observe and store the signals received at associated device inputs resulting from interconnect test patterns driven by the transmit cells 10. It should be appreciated that each device in a group of interconnected devices would have appropriate transmit cell register chains associated with device outputs and appropriate receive cell register chains associated with device inputs. For boundary scan testing, one or more transmit register chains would be enabled, and one or more receive register chains would be enabled, where the receive register chains are for inputs that are interconnected with outputs associated with the enabled transmit register chains.

Referring in particular to FIG. 1, each transmit cell 10 includes a three-state output buffer 11 which has its output connected to an associated device output pin 30. The input to the three-state buffer 11 is provided by a 2-to-1 multiplexer 13 whose inputs include a test control signal TEST and a device output signal from the interior logic of the integrated circuit in which the cell is implemented. The multiplexer 13 is controlled by a test mode control signal TMODE. The test control signal TEST, the test mode control signal TMODE, and a global disable signal GD are provided by a test controller 60 which can reside either internally or externally to the integrated circuit device in which the cell is implemented.

The three-state buffer 11 is controlled by the output of an AND gate 15 which has an inverting input that receives the global disable signal GD from the test controller 60. A further input to the AND gate 15 is provided by an OR gate 17 which has an inverting input that receives the Q output of a scan flip-flop 19. The other input to the OR gate is provided by the test control signal TEST from the test controller 60. The input to the scan flip-flop 19 is provided by the Q output of a scan flip-flop prior in sequence in the scan chain in which the scan flip-flop 19 is implemented or by the external serial input to the scan chain. The output of the scan flip-flop 19 is provided to the scan flip-flop next in sequence in the scan chain or to the serial output of the scan chain.

For normal device operation (i.e., where the output of the buffer corresponds to the device output signal) the multiplexer is controlled to provide the device output OUT to the buffer which is enabled by GD being low and TEST being high. For testing in accordance with the invention, as described more fully herein, the three-state buffer is selectively enabled to drive a high output by setting the global disable signal low and setting the test signal high, which will cause the three-state buffer to drive a high output regardless of the state of the scan flip-flop output. Also, the three-state buffer is selectively disabled by setting the global disable signal to low, which will cause the three-state buffer to be disabled regardless of the states of the scan flip-flop output and the TEST signal.

Referring in particular to FIG. 2, each receive cell 20 includes an input buffer 51 whose input is connected to the associated device input pin 40 and also to one terminal of a hold-up resistor 53 which has its other terminal connected to an appropriate voltage $V_{DD}$. Alternatively, a hold-up current source could be utilized in place of the hold-up resistor. The output of the input buffer 51 is provided to interior logic in the device and as an input to a 2-to-1 multiplexer 55 which is controlled by a test mode control signal SCAN MODE and which has its output connected to a scan flip-flop 57. The other input to multiplexer 55 is provided by the Q output of a scan flip-flop prior in sequence or by the input to the scan chain in which the scan flip-flop 57 is implemented. The Q output of the scan flip-flop 57 is provided to the scan flip-flop next in sequence in the scan chain or to the serial output of the scan chain.

In accordance with conventional logic circuit designs, including CMOS logic circuits, the logical state of the input to the input buffer will be as follows as a result of the hold up resistor which by way of illustrative example for CMOS logic circuits can be about 100 kilo ohms. The input will be high if driven high, and it will be low if driven low. If the input is driven high, it will remain high if subsequently driven with a disabled driver (i.e., one which is in the high impedance state). If the connection to the input pin is open, the input will pull high on application of power to the circuit device, and then remain high. In other words, the input to the buffer must be driven low in order to maintain a low logical level.

In operation, the interconnections between devices are tested by selectively loading a sequence of test patterns into the scan flip-flops of a plurality of transmit cells. Pursuant to each serially loaded pattern, the device outputs associated with the transmit cells containing the test pattern are driven pursuant the particular loaded pattern, and the signals at device input pins of selected receive cells are stored and then scanned out for analysis, for example pursuant to well known boundary scan techniques. It should be appreciated that input scanning of a test pattern into transmit scan cells can occur simultaneously with the output scanning of test results from receive scan cells. Depending upon implementation and the nature of the interconnections being tested, one or more transmit scan chains can be operated concurrently and one or more receive scan chains can be operated concurrently.

Figure 3:
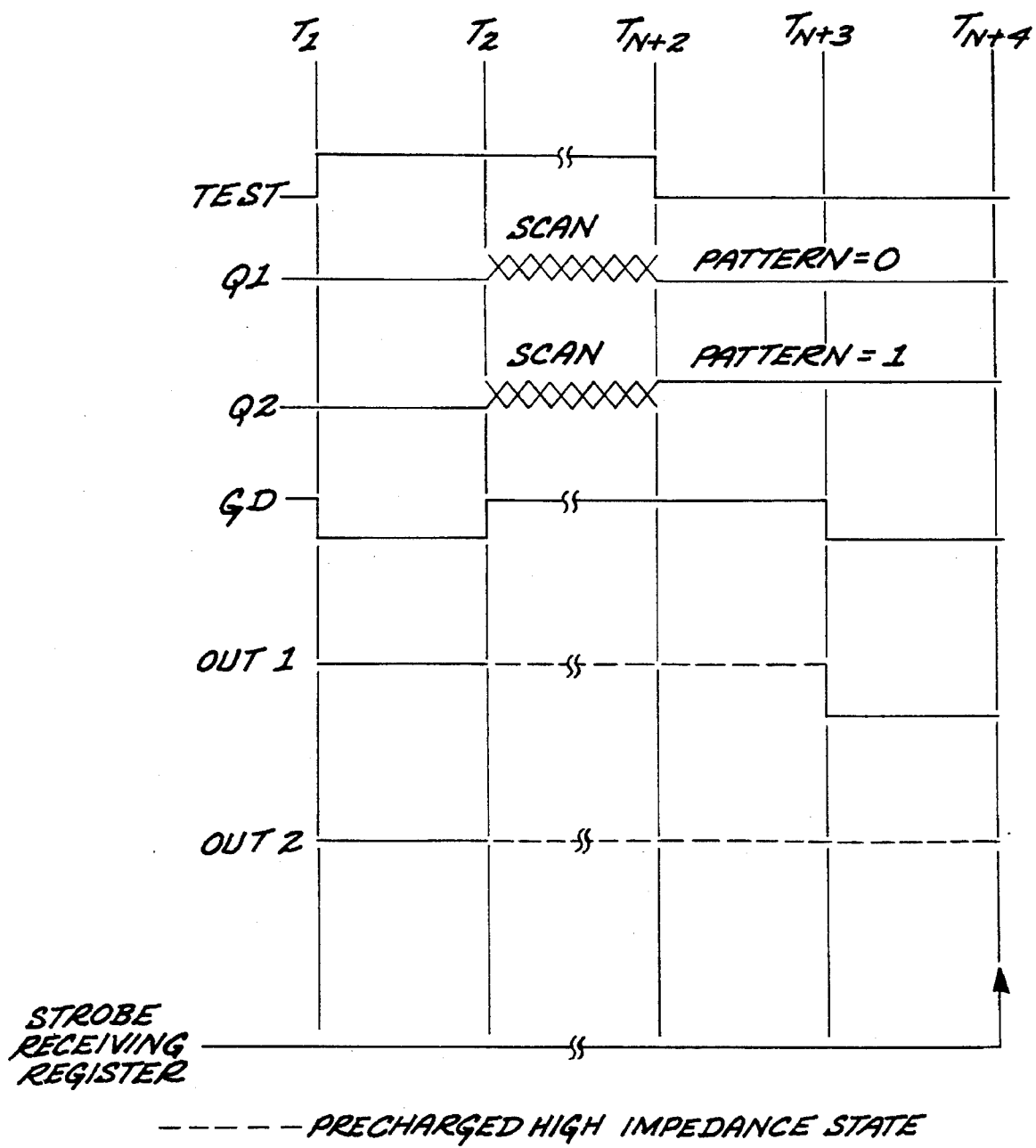
FIG. 3 is a timing diagram helpful in understanding the operation of the boundary scan circuit of FIG. 1.

Referring now to FIG. 3, set forth therein is a timing diagram illustrating the pertinent signals of a transmit scan chain and a receive scan chain which are enabled for boundary scan testing of interconnects between the device outputs associated with the transmit scan chain and device inputs associated with the receive scan chain. The timing diagram illustrates one test cycle and shows the signals for two transmit cells in order to illustrate the operation of a transmit cell for the scanned in test values of 0 and 1. It should be appreciated that all of the transmit cells in a scan chain are clocked and controlled in parallel, as are all of the receive cells in a scan chain.

The test mode control signal TMODE to the multiplexers 13 is at the level whereby the multiplexer output corresponds to the test control signal TEST. At the active clock transition $T_1$, TEST transitions to a high logic level, the Q outputs of the scan flip-flops 19 do not change (and are immaterial), and the global disable signal GD transitions to low. Pursuant to the TEST being high and GD being low, the three-state buffers 11 of the transmit cells are enabled to drive high outputs regardless of the states of the outputs of the scan flip-flops 19. At the active clock transition $T_2$, TEST remains high, the scan flip-flops 19 are controlled to operate in the serial mode so that test data can be scanned in, the scan flip-flops 57 of the receive cells are controlled so that they operate in the serial mode so that any result data can be scanned out, and the global disable signal GD is transitioned high. As a result of the global disable signal GD transitioning high, the three-state buffers 11 are disabled regardless of the state of the TEST signal and regardless of the states of the outputs of the scan flip-flops 19, and their outputs change to the high impedance state. During N active clock transitions following the active clock transition $T_2$, test data is scanned into the scan flip-flops 19, where N is determined by the number of active clock transitions required for scanning test values into the scan flip-flops 19 of the transmit scan chain.

At the active clock transition $T_{N+2}$, TEST is transitioned low, and the scan flip-flops 19 are controlled to operate in the parallel mode so as to provide respective Q outputs to the respective OR gates 17, one of such outputs Q1 being shown as low and another Q output Q2 shown as being high. The states of the corresponding three-state buffers are identified as OUT1 and OUT2. At the active clock transition $T_{N+3}$, the global disable signal GD is transitioned low, and each of the resulting respective states of the three-state buffers 11 depends on the Q output of the associated scan flip-flop 19. If the Q output of a scan flip-flop 19 is low, as represented by Q1 on the timing diagram, the transition of GD to low enables the three-state buffers 11 to provide a low output in response to the low level of the TEST input signal, as represented by OUT1 in the timing diagram. If the Q output of a scan flip-flop 19 is high, as represented by Q2 on the timing diagram, the three-state buffer 11 remains disabled as a result of the low input to the AND gate 15 provided by the OR gate 17. Thus, the three-state buffer 11 associated with a scan flip-flop 19 that contains a high test value remains in the high impedance state, as represented by OUT2 in the timing diagram. At the next active clock transition $T_{N+4}$, the output of the receiver buffer 51 is strobed into the scan flip-flop 57.

The overall operation of participating transmit and receive scan circuits is generally as follows.

1. All interconnections under test are universally driven high by the three-state buffers associated with device outputs.

2. With all device outputs globally held in the high impedance state (where they will remain at the voltage corresponding to logical high because of the hold-up resistors or current sources), the first test pattern is scanned into the scan flip-flops of the transmit cells. Alternatively, the device outputs can be globally held in the logical high state by maintaining the global disable signal GD low and the TEST signal high during while scanning.

3. After the first pattern is loaded, all three-state buffer outputs are globally set to the high impedance state and the TEST signal input to the disabled three-state output drivers is set to low.

4. The global disable signal GD is then changed to a logical high, and the outputs of the three-state buffers will then either remain in the high impedance state (holding a logical high as a result of the earlier "precharge") or provide a logical low output, depending on the test pattern value which was loaded into the associated scan flip-flop.

5. The scan flip-flops of the receive cells now sample the signals at the device inputs.

6. All interconnections are again driven universally high and the second pattern is similarly applied. While the second pattern is being scanned in, the receive scan flip-flops will typically be scanned out.

The pattern set (i.e., a group of test patterns) applied with the sequence just described may be among a class which has been designed for interconnection testing.

In accordance with the invention, where a pattern demands a particular output be high, the three-state buffer for that output is disabled (by appropriately setting the scan flip-flop), pursuant to which the output provides a "soft high." Where a pattern demands an output be low, the three-state buffer for that output is enabled (by appropriately setting the scan flip-flop), pursuant to which the output of the three-state buffer is a "hard low" as a result of the TEST signal being low.

As is well known, interconnection test patterns for boundary scan testing are intended create cases where each output differs from all others at some time in the pattern set. With this invention, if a "bridge" failure occurs, an expected "soft high" will always be driven to a "hard low", which unambiguously indicates a bridge fault. The reason for the hard low is that one of the output drivers is applying a low to the input which would be at a logical high but for the short or bridge failure.

Interconnection test patterns also assure that every interconnection signal is driven to both high and low logic levels at different times in the pattern set. With this invention, an "open" failure always results in one or more inputs always reading high unambiguously, and therefore the absence of a low reading during the test always identifies an "open" fault. The unambiguous logical high indicative of an open fault is due to the use of hold up resistors or current sources on the input buffers. The hold up resistors or current sources cause any open inputs to slowly pull up to the logical high state subsequent to the application of power to the circuit device. A finite amount of time is allowed for this pull up prior to initiation of testing, to assure that all open inputs will be observed as unambiguously high.

In testing, the patterns are applied sufficiently fast that precharging is required to change inputs from low to high during testing so that a low-to-high output driver is tested; if it is inoperative, the response sampled immediately subsequent to a low-to-high transition will still be low.

Thus, the invention causes unambiguous high or low levels to appear at inputs during respective bridge (short) and open failures, so fault detection and isolation are fully deterministic.

The invention further advantageously allows for detection of potentially shorted signals wherein a short between signals is of moderate or high resistance that is less than resistances of the hold up resistors (for instance, a "whisker" of metal between traces with resistance of hundreds or thousands of ohms). In the case of a potential short, an expected "soft high" will be driven to a "hard low", which unambiguously indicates a bridge fault. The reason for the hard low is that one of the output drivers is applying a low to the input which would be at a logical high but for the potential short.

The scan circuitry of the invention also provides for circuit protection. In case of bridging faults, conventional methods allow the shorted drivers to contend (try to drive each other to the opposite state). This draws excessive current and is potentially damaging. Contention also occurs if test patterns are incorrectly written or applied, a common occurrence. The invention makes contention impossible, since all enabled three-state buffers are in the same driven logical state, and the remaining three-state buffers are in the high impedance state, at all times. Since any open connections to input pins are maintained high by the hold up resistors or current sources, an open pin will not cause the input to its associated buffer to drift to an ambiguous level, which protects inputs from possible damage due to spurious oscillations. Further as a result of the hold up resistors or current sources, the inputs to the input buffers are advantageously prevented from floating.

It is noted that the invention can also be implemented with reversed polarities with hold down resistors or current sources tied to ground. The input TEST signal would be the inverse of that shown in FIG. 3, precharge would be done to the low state, and active signal driving during patterns could be to a hard high (i.e., a three-state buffer would be enabled only if its scan flip-flop contained a logical high). With a hold down resistor or current source, the input to an input buffer that is driven low would remain low if the connection to its input pin becomes open. Further, the input to an input buffer that is driven high will change to low if the connection to its input pin becomes open.

Figure 4:
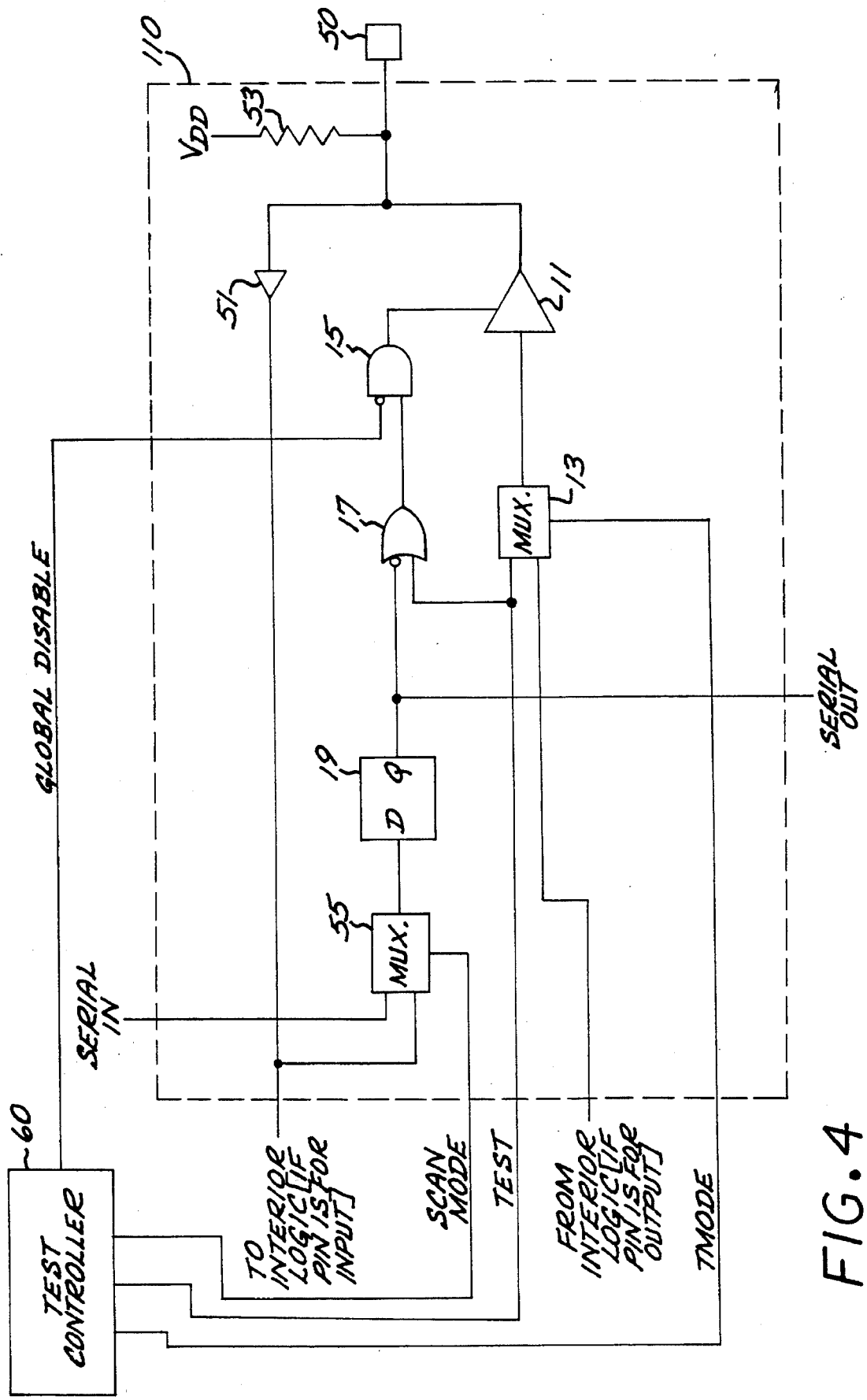
FIG. 4 is a schematic diagram of a series of bidirectional scan cells that include precharge circuitry in accordance with the invention.

Referring now to FIG. 4, set forth therein is a bidirectional scan cell 110 that provides the precharge function in accordance with the invention. The scan cell 110 combines the functions of the scan cells 10 and 20 of FIGS. 1 and 2, and can be used for either or both of the following functions:

(a) As a scan cell for device signals which functionally require a bidirectional I/O pin.

(b) For bidirectional testing, which can provide for easier implementation of interconnection testing and more thorough interconnection testing.

Further as to bidirectional testing, reference is made to commonly assigned U.S. Pat. No. 5,202,625, incorporated herein by reference; and commonly assigned U.S. application Ser. No. 07/725,161, "Fault Isolation Diagnostics (FID)," filed Jul. 3, 1991, and incorporated herein by reference. The latter application also describes a technique by which the buffers of a bidirectional scan cell can be tested pursuant to self-testing of the scan cell.

Each scan cell contains the components of the transmit cell 10 of FIG. 1 with the addition of an input buffer 51, a hold-up resistor 53, and a 2-to-1 multiplexer 55, which provide substantially the same functions as corresponding elements in the receive cell 20 of FIG. 2. The 2-to-1 multiplexer is controlled by a SCAN MODE signal for selecting one of the two inputs to the multiplexer which are the output of the input buffer 51 and the Q output of the scan flip flop prior in sequence or by the input to the scan chain.

The output of the input buffer is further connected to the interior logic of the circuit device if the associated device pin 50 provides a device input function. The connection for interior logic to the input of the 2-to-1 multiplexer 13 is utilized if the associated device pin 50 provides a device output function.

Each cell 110 is bidirectional and can be utilized with device inputs and outputs, and can advantageously provide the pre-charge functions described above relative to the transmit cell 10 and the receive cell 20. Thus, the bidirectional cells 110 in a selected scan chain can function in the same manner as the transmit cells 10 of FIG. 1, while the bidirectional cells 110 in another scan chain can function in the same manner as the receive cells 20 of FIG. 2 by having their output buffers globally disabled. For the transmit function, the multiplexer 13 is controlled so that its output corresponds to the TEST signal, and the multiplexer 55 is controlled so that its output corresponds to the scan serial input. For the receive function, the multiplexer 55 is controlled so that its output corresponds to the output of the input buffer 51, and the output buffer 11 is disabled, for example pursuant to the global disable signal.

A further advantage of the bidirectional scan cell is capability of monitoring itself while transmitting a test signal on its associated I/O pin. The self-monitored acquired values in the scan flip-flops of transmitting scan cells can be scanned out and analyzed to detect faults in the input and output buffers.

The invention essentially contemplates the use a three-state output buffer and the capability of precharging inputs of scan cell input buffers to the logical level that an input to an input buffer would attain, given enough time, if such input were an open connection. This allows for testing procedures that produce results having reduced ambiguity and errors, provides for circuit protection, and detection of potentially shorted signals.

Although the foregoing has been a description and illustration of specific embodiments of the invention, various modifications and changes thereto can be made by persons skilled in the art without departing from the scope and spirit of the invention as defined by the following claims.

What is claimed is:

1. A boundary scan transmit cell for use in a circuit device having a plurality of device input pins and device output pins wherein each transmit scan cell is associated with a device output pin, the boundary scan transmit cell comprising:

a scan flip-flop for selectively storing a scan input and for providing a scan flip-flop output that corresponds to the stored scan input;

a three-state buffer responsive to an input signal for providing a buffered output signal on an associated device output pin;

a test controller for providing a global disable signal and a test signal;

selection means responsive to said test controller for providing said test signal or a device signal as said input signal for said three-state buffer;

disabling means responsive to said scan flip-flop and said test controller for (1) enabling said three-state buffer to provide said buffered output at a first logical state when said global disable signal is of a second logical state and said test signal is of the first logical state, regardless of the state of said scan flip-flop output, (2) disabling said three-state buffer when said global disable signal is of the first logical state regardless of the states of the scan flip-flop output and said test signal, and (3) enabling said three-state buffer to provide said buffered output at the second logical state when said global disable signal is of the second logical state, said scan flip-flop output is of the second logical state, and said test signal is of the second logical state, wherein said disabling means includes:

(i) an OR gate having a negated input for receiving the scan flip-flop output at its negated input and for receiving the test signal as another input, and (ii) an AND gate having a negated input for receiving the global disable signal at its negated input and for receiving the output of said OR gate as another input.

2. A bidirectional boundary scan cell comprising:

a transmit scan flip-flop for storing a scan input and providing a scan flip-flop output that corresponds to the stored scan input;

a three-state buffer responsive to an input signal for providing a buffered output signal on a device input/output pin;

an input buffer having an input connected to the device input/output pin;

holding means connected to the input of said input buffer for allowing the input of said input buffer to be driven to a second logical state or a first logical state, and for changing the input to said input buffer to the second logical state if such input is an open connection or a high impedance connection, said holding means allowing the input to the buffer to change to the first logical state when driven to the first logical state;

a receive scan flip-flop for controllably storing the output of said input buffer;

a test controller for providing a global disable signal and a test signal;

selection means responsive to said test controller for providing said test signal or a device signal as said input signal for said three-state buffer; and disabling means responsive to said scan flip-flop and said test controller for (1) enabling said three-state buffer to provide said buffered output at a first logical state when said global disable signal is of a second logical state and said test signal is of the first logical state, regardless of the state of said scan flip-flop output, (2) disabling said three-state buffer when said global disable signal is of the first logical state regardless of the states of the scan flip-flop output and said test signal, and (3) enabling said three-state buffer when said global disable signal is of the second logical state, said scan flip-flop output is of the first logical state, and said test signal is of the second logical state.

3. The bidirectional boundary scan transmit cell of claim 2 wherein said disabling means includes:

an OR gate having a negated input for receiving the scan flip-flop output at its negated input and for receiving the test signal as another input; and an AND gate having a negated input for receiving the global disable signal at its negated input and for receiving the output of said OR gate as another input.

* * * * *